US008583827B2

(12) United States Patent
Stavrakos et al.

(10) Patent No.: US 8,583,827 B2
(45) Date of Patent: Nov. 12, 2013

(54) DYNAMIC DATA OPTIMIZATION IN DATA NETWORK

(75) Inventors: Nicholas Stavrakos, Mountain View, CA (US); Chris Koopmans, Sunnyvale, CA (US)

(73) Assignee: Citrix Systems, Inc., Fort Lauderdale, FL (US)

( * ) Notice: Subject to any disclaimer, the term of this patent is extended or adjusted under 35 U.S.C. 154(b) by 782 days.

(21) Appl. No.: 11/439,009

(22) Filed: May 22, 2006

(65) Prior Publication Data

US 2006/0271652 A1    Nov. 30, 2006

Related U.S. Application Data

(60) Provisional application No. 60/685,260, filed on May 26, 2005.

(51) Int. Cl.
*G06F 15/16* (2006.01)
*H04L 29/06* (2006.01)

(52) U.S. Cl.
CPC ..................................... *H04L 29/06* (2013.01)
USPC ........................................................ 709/246

(58) Field of Classification Search
USPC ........... 709/246, 203, 213, 231; 370/232, 356
See application file for complete search history.

(56) References Cited

U.S. PATENT DOCUMENTS

| | | | |
|---|---|---|---|
| 6,134,589 A * | 10/2000 | Hultgren | 709/227 |
| 6,631,122 B1 * | 10/2003 | Arunachalam et al. | 370/332 |
| 6,842,431 B2 * | 1/2005 | Clarkson et al. | 370/254 |
| 2002/0095400 A1 * | 7/2002 | Johnson et al. | 707/1 |
| 2002/0131072 A1 | 9/2002 | Jackson | |
| 2002/0131447 A1 * | 9/2002 | Krishnamurthy et al. | 370/465 |
| 2003/0065803 A1 * | 4/2003 | Heuvelman | 709/231 |
| 2004/0047290 A1 * | 3/2004 | Komandur et al. | 370/230 |
| 2004/0111398 A1 * | 6/2004 | England et al. | 707/3 |
| 2006/0126556 A1 * | 6/2006 | Jiang et al. | 370/328 |

FOREIGN PATENT DOCUMENTS

| | | |
|---|---|---|
| EP | 0 992 922 A2 | 4/2000 |
| EP | 1 227 639 A2 | 7/2002 |
| WO | WO 01/59575 A1 | 8/2001 |

OTHER PUBLICATIONS

International Preliminary Report on Patentability for PCT/US2006/019990, mailed on Dec. 13, 2007.
International Search Report and Written Opinion of the International Searching Authority for International Application No. PCT/US2006/01990, mailed Oct. 26, 2006, 14 pages.

* cited by examiner

*Primary Examiner* — Peter Shaw
(74) *Attorney, Agent, or Firm* — Finnegan, Henderson, Farabow, Garrett & Dunner LLP

(57) ABSTRACT

A system including a client device communicatively coupled to a first wireless network, wherein the client device has the ability to request a web page from a content server, and an optimization server is configured to receive network data associated with the characteristics of the first wireless network, to provide tuning settings based on the network data, to receive response data from the content server, and to transmit optimized response data to the client device, wherein the response data corresponds to a request for a web page from a client device and the optimized response data corresponds to the response data being altered based on the provided tuning settings.

20 Claims, 3 Drawing Sheets

DYNAMIC DATA OPTIMIZATION IN DATA NETWORK

CROSS REFERENCE TO RELATED PATENTS

This application claims the benefit of U.S. Provisional Application No. 60/685,260, filed May 26, 2005, "Advanced Data Optimization." This provisional application is incorporated herein by reference.

BACKGROUND INFORMATION

Internet access is becoming pervasive; wireless access is available anywhere one can use a mobile phone. However, user experience is far from uniform on these networks. The network topology and access type can greatly affect the user experience. Consider the following examples:

First, a user can connect to a corporate 100 Mbps LAN, and access Internet sites. How fast the connection "feels" to the user can be dominated by the corporate uplink to the backbone. For example, if it is a 1000 person company sharing a 384 Kbps DSL link, it will be very slow. However, if they have a 1 Mbps T1 link shared amongst 50 people, it can feel much faster.

Second, a user can setup a 11 Mbps WiFi network in their home and use a 2 Mbps cable modem to connect to the Internet. In this case, the user's experience will be dominated by the 2 Mbps cable modem that is actually shared by all the people on the block.

Finally, a user can use a 40 Kbps GPRS modem to connect to a mobile network, which has a T1 connection to the backbone. In this case, the T1 is shared amongst all of the connected users, but unless the network provider is over-provisioned, this link will be under utilized. Thus, the GPRS link will dominate the user experience.

The common thread in all of these scenarios is that disparate networks connect together to give a user access to the Internet, but the user experience is typically dominated by a single link in that topology.

DESCRIPTION OF THE EMBODIMENTS

Reference will now be made in detail to the exemplary embodiments implemented according to the invention, the examples of which are illustrated in the accompanying drawings. Wherever possible, the same reference numbers will be used throughout the drawings to refer to the same or like parts.

Figure 1:
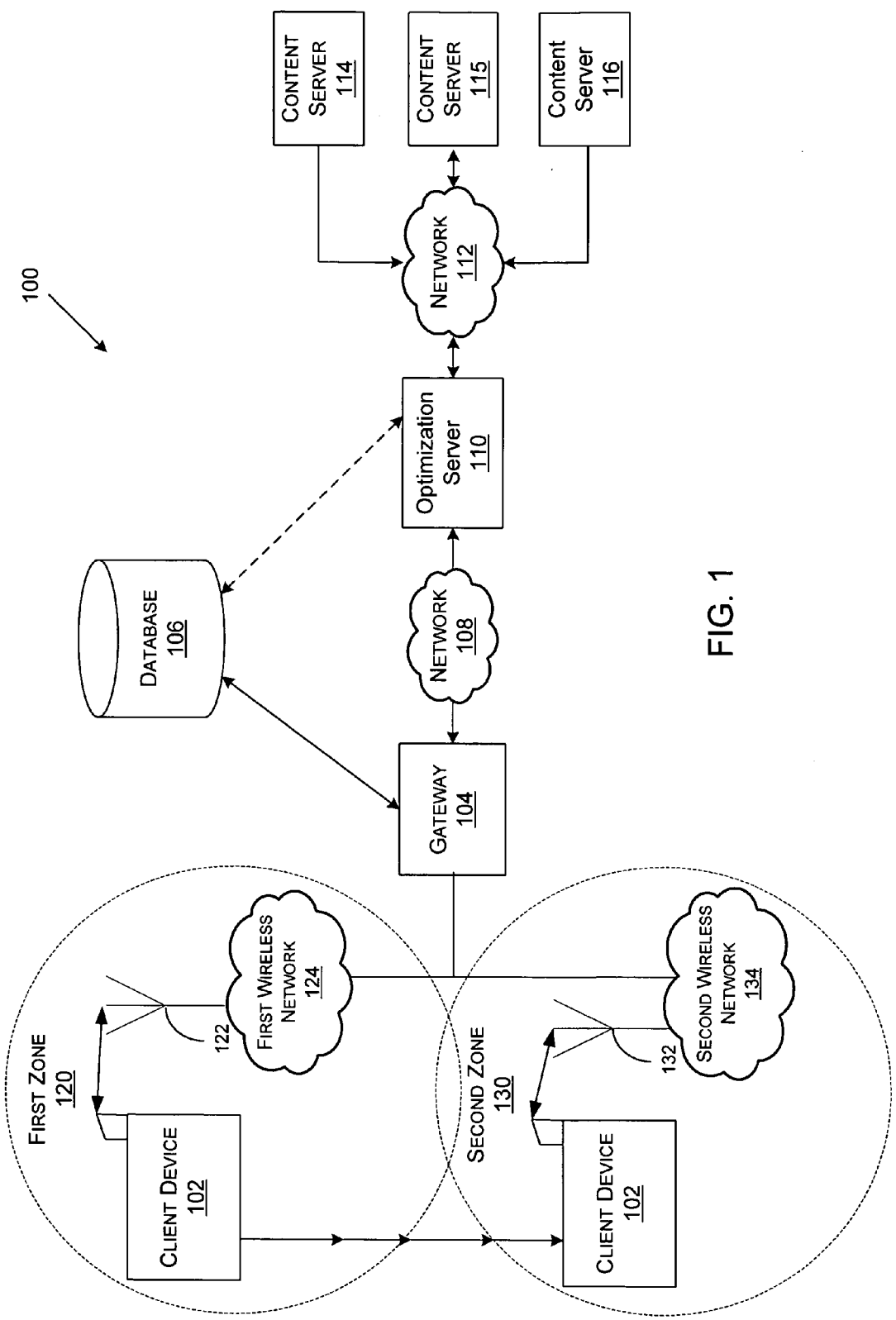
FIG. 1 is a block diagram of an exemplary system.

FIG. 1 is a block diagram of an exemplary system 100, which can be any type of system that transmits data over a network. For example, the exemplary system can include a user agent accessing a web page from content servers through the Internet. The exemplary system can include, among other things, a client device 102, a gateway 104, a database 106, one or more networks 108, 112, an optimization server 110, one or more content servers 114-116, a first zone 120 including a first wireless transmission station (WTS) 122 and a first wireless network 124, and a second zone 130 including a second WTS 132 and a second wireless network 134.

Client device 102 is a device that can access remote services through wireless means. For example, client device 102 can be any type of device that has wireless communication capabilities, such as a computer, a laptop, a PDA, a cell phone, a portable game machine, or any device accessing the Internet. In some embodiments, client device 102 stores a user's preferences, such as whether a user prefers a faster downloadable webpage or a better webpage image, and network preference (e.g., AT&T v. Alltel). Additionally, the client device can include a user agent that acts as a client device application used with a network protocol. For example, the user agent could be a web browser, a search engine crawler, a screen reader, or a Braille browser, and the user agent could be used to access the Internet. The user agent can be a software program that transmits request data (e.g. an HTTP/HTTPS/WAP request, etc.) to a web server and receives a corresponding web page in response to the HTTP request. For example, client device 102 could be the Bytemobile Optimization Client Gateway 104 is a device that converts formatted data provided in one type of network to a particular format required for another type of network. Gateway 104, for example, may be a server, a router, a firewall server, a host, or a proxy server. The gateway 104 has the ability to transform the signals received from wireless networks 124, 134 into data packets that network 108 can understand and vice versa. For example, gateway 104 can be a Gateway GPRS Support Node (GGSN) or a Packet Data Support Node (PDSN).

Database 106 is a remote data storage device that stores information relating to the identification of a user and/or client device. For example, database 106 can store information, such as phone number of the client device, cell site of mobile phone, the charging plan for the phone, user's name, user password, user preferences, etc. The database receives authentication requests, authenticates the user and the client device based on the data within the authentication requests, and grants the client device the ability to connect when the database authenticates the client device. In some embodiments, database 106 receives these authentication requests from gateway 104. In some embodiments, database 106 receives these authentication requests from optimization server 110.

Networks 108 and 112 can include any combination of wide area networks (WANs), local area networks (LANs), or wireless networks suitable for networking communication such as Internet communication.

Optimization server (OS) 110 is a server that provides communications between gateway 104 and content servers 114-116. For example, OS 110 could be a Bytemobile Optimization Services Node. OS 110 can provide optimized response data to client device 102 based on received network data. OS can store tuning settings that are based on the network characteristics of the wireless network that client device 102 is connected to. In some embodiments, OS 110 stores a user's preferences. OS 110 can include optimization techniques, which are further described below. Further, in some embodiments, OS 110 can include or be communicatively coupled with a control filter node that would determine whether any of the information received from the content servers needs to be filtered based on the user's preferences stored at the client device. In some embodiments, the user's preferences can be stored at OS 110 instead of the client device.

Content servers 114-116 are servers that receive the request data from user agent 102 and/or OS 110, process the request data accordingly, and return the response data back to user agent 102. For example, content servers 114-116 can be a web server, an enterprise server, or any other type of server. Content servers 114-116 can be a computer or a computer program that is responsible for accepting HTTP requests from the user agent and serving the user agents with web pages.

Wireless networks 124, 134 are telephone or computer networks that can use radio signals as their carrier or physical layer. A wireless network supports devices that communicate using wireless technology. Wireless networks 124, 134 can be any type of wireless network, such as a cellular network or a CDMA network using a 2G or 3G telecommunication standard. A wireless network hub or router (not shown) can be used to bridge the wireless network to traditional Ethernet or home phone line networks, or provide a shared internet connection.

As shown in FIG. 1, client device 102 may communicate with a wireless network by communicating data to a wireless telecommunication station (WTS), for example WTSs 122, 132. WTSs 122, 132 are radio transmitter/receivers, such as antennas, base stations etc., that have the ability to maintain communications with client device 102 within a given range. For example, once a client device is detected to be out of the range of first zone 120, the first WTS 122 may pass the information to the second WTS 132 of a second zone 130 so the second WTS 132 can maintain communications with the client device.

Figure 2:
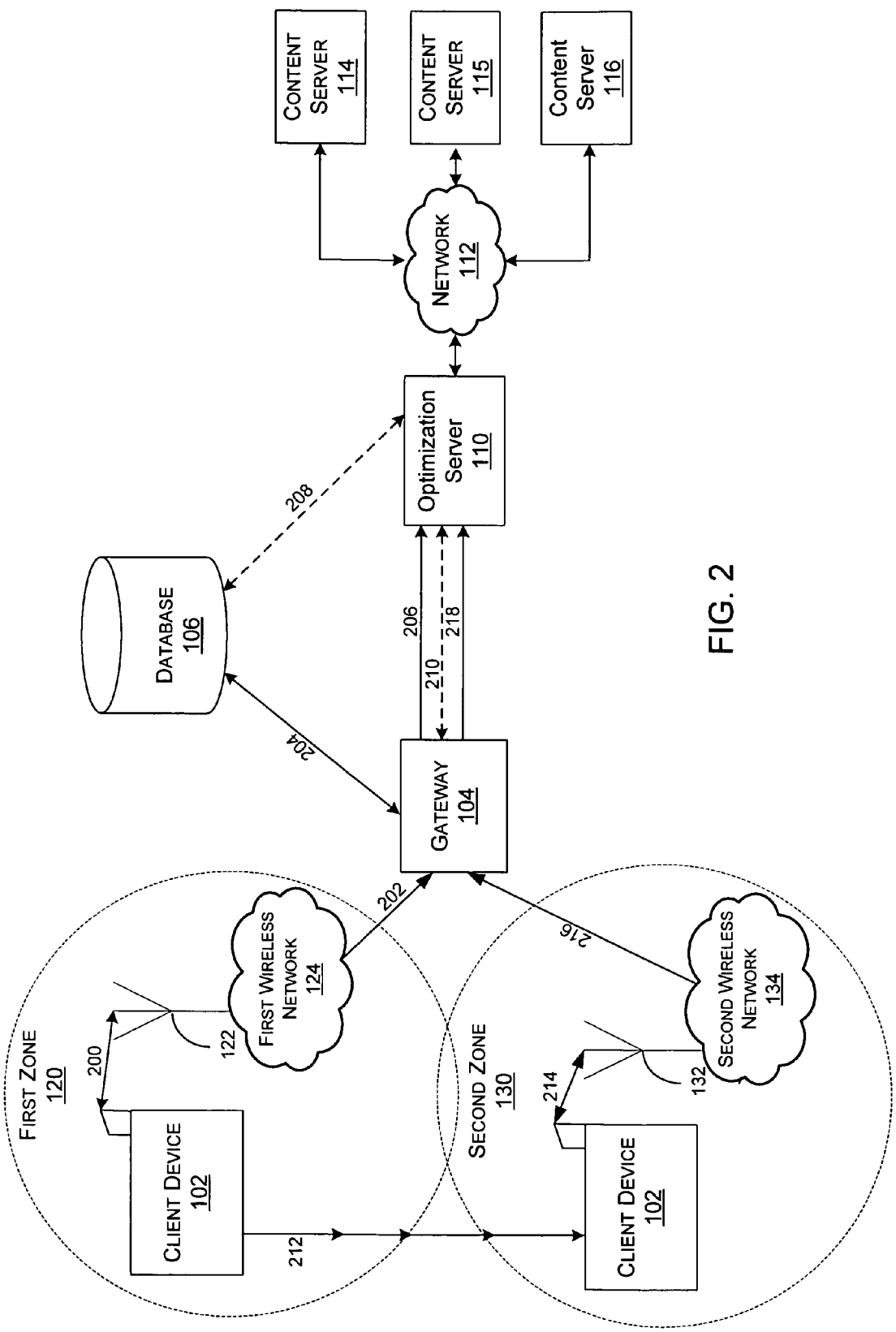
FIG. 2 is a block diagram illustrating an exemplary embodiment for providing network data updates to the optimization server.

FIG. 2 is a block diagram illustrating an exemplary embodiment for providing network data updates to the OS. In this exemplary embodiment, it is assumed that first zone 120 includes a first WTS 122 that has the ability to receive communications from a client device and connect the client device to the first wireless network 124. Further, second zone 130 includes a second WTS 132 that has the ability to receive communications from client device and connects the client device to the second wireless network 134. For this particular embodiment, first wireless network 124 is different than second wireless network 134. For example, first wireless network 124 is a 2.5G standard, while second wireless network 134 is a 3G standard. In some embodiments, wireless networks 124, 134 can be the same or similar to each other, but they may have different network properties. For example, first wireless network 124 may have less traffic than second wireless network 134. As described below, OS 110 can provide optimized response data to client device 102 based on the characteristics (e.g., type and/or properties) of the wireless network that the client device 102 is connected to. Client device 102, which is located in first zone 120, establishes (200) communications with first wireless network 124 through first WTS 122.

After first wireless network 124 receives the communications, first wireless network 124 routes (202) the signal corresponding to the communication to gateway 104. Gateway 104 converts the signal into IP based data packets so that network 108 and/or database 106 can process the data accordingly. Gateway 104 can then query (204) database 106 by providing an authentication request in exchange for an authentication response. Once database 106 has received the authentication request, database 106 can authenticate the request by identifying the client device 102 and/or the user on client device 102. For example, database 106 identifies the user by determining whether the phone number from client device 102 along with the user's name and password, match the information stored at database. Based on the authentication, database 106 transmits an authentication response to gateway 104. If the authentication response is valid, gateway 104 can connect the user to the rest of the network. If the authentication response is invalid, gateway 104 has the ability to prevent the connection. In this exemplary embodiment, the authentication information is assumed to be valid. It will be readily appreciated that in some embodiments, instead of gateway 104 querying the database 106, OS 110 can query database 106 and authenticate the client device 102.

After gateway 104 has authenticated the user, gateway 104 forwards (206) the data packets to OS 110. For example, gateway 104 can transmit the data packets to the OS 110 using a Remote Authentication Dial In User Service (RADIUS) protocol. In some embodiments, gateway 104 can provide network data to any necessary nodes, such as database 106 and/or OS 110, the type of network the client device is using or if the client device has switched networks. The network data can be any type of data that describes the network, such as the type of network that the user is connected to (e.g., 2G, 2.5G, 3G, WLAN, etc.), the cell tower the user is using, the IP address allocated to the user, the phone number of the user, etc. When gateway 104 is notified of a network switch, gateway 104 uses the RADIUS protocol to "push" the network data to OS 110. In some embodiments, gateway pushes this network data to database 106, which then pushes the network data to OS 110. Once OS 110 receives the network data, OS 110 can adjust its tuning settings based on the network data and provide optimized response data to the client device based on these settings. For example, OS 110 can use the network data to adjust the tuning settings and provide advanced optimization techniques, such as among other things, determining whether it would be more beneficial to send a higher quality image to the client device or if the image can have a lesser quality as long as the image gets to the client device faster. When the OS 110 receives response data from a content server 114, the OS 110 can manipulate the response data based on the optimization techniques and transmit the manipulated optimized response data to the client device 102.

In some embodiments, instead of gateway 104 providing the network data, OS 110 can "pull" (208) the network data from any device on the network, such as database 106. OS 110 can request the network data from database 106 via a lightweight directory access protocol (LDAP) interface. In response, database 106 can transmit a response that provides network data to OS 110 and hence, the OS 110 "pulls" the network data from database 106. Once again, the OS can adjust its tuning settings based on the network data and provide optimized response data to the client device based on these settings.

In some embodiments, OS 110 can sample (210) the network characteristics of the connection to client device 102 and receive network data that assists the OS 110 in determining the type of wireless network that client device 102 is connected to and/or whether the client device 102 has switched networks. OS 110 can use various feedback mechanisms within the protocol to determine this network data. Such feedback mechanisms can include tracking estimated bandwidth and round trip times in the TCP stack. Based on the feedback, OS 110 can determine which network a particular TCP connection is routed through. Other feedback mechanisms can include, among other things, determining the packet loss, instantaneous packet loss, average packet loss, trends in packet loss (whether 5 data packets have been lost in the last 100, which 5 data packets were they—the first five, the last five), instantaneous latency, jitter (changing latency), average latency, instantaneous bandwidth, average bandwidth over a period, and how the bandwidth changes over time. In addition, these feedback mechanisms may be triggered periodically or based on the input received from the other nodes to determine the network associated with the client device 102. For example, OS 110 could pull data from the database periodically or if OS 110 detects a change in latency, OS 110 could sample the network to determine which wireless network that client device 102 is connected to. For the best results, OS 110 can be provided with network data by using all three embodiments of "pushing", "pulling", and sampling the network data.

OS 110 can use the network data to optimize performance for a user of client device 102. There are a number of ways to invoke a specific set of optimization and tuning settings based on the network. These preset tuning settings and configurations can be stored at OS 110 for each set of network characteristics or network types so that OS 110 can provide optimal performance to client device 102. These stored tuning settings may be predetermined and stored in advance for each type of wireless network. For example, when OS 110 detects that client device 102 is using a 2G wireless network, OS 110 can adjust its tuning settings by accessing the stored tuning settings that correspond to the 2G network so that it can provide optimal, efficient optimized response data to client device 102. OS 110 can also take into consideration the characteristics of the wireless network to configure or reconfigure the tuning settings. For example, after OS 110 provides the 2G tuning settings, OS can further adjust its tuning settings by receiving subsequent network data, such as the speed of request/response traffic at the 2G wireless network, and inputting the network data into algorithms that are designed to modify the tuning settings to further optimize performance. Or OS 110, without determining the type of network, adjusts the tunings based on the feedback mechanisms which describe the network's characteristics. Furthermore, OS 110 has the ability to adjust the tuning settings based on the user's preferences, such as the downloading time for a web page is more important to a user than the webpage's appearance or blocking all non-text content when using a small-screen, limited-bandwidth client device.

Because different situations need different optimization algorithms, optimization technology first classifies the type of network being used and the types of data it carries. For instance, low-speed networks benefit mainly from data reduction techniques, whereas high-speed networks benefit mostly from protocol acceleration techniques. OS 110 can determine the right mix of algorithms that are used for each instance. These optimization algorithms can include lossless compression (GZIP, DEFLATE, etc.) per the HTTP RFC, lossy compression of images (GIF, JPEG, PNG, etc.), and the optimization techniques described in "Method and System for Dynamic Interleaving" (U.S. application Ser. No. 10/871, 905), "Method for Delta Compression" Ser. No. 11/439,068, "Method and System for Object Prediction" Ser. No. 11/439, 003, and "Method for Multipart Encoding" Ser. No. 11/439, 330, all of which are hereby incorporated by reference. Further, OS 110 selects appropriate algorithms at the beginning of each session and modifies them as needed, in real time, as the session progresses.

By vastly reducing the amount of data being transmitted across the network, OS 110 minimizes transfer times and bandwidth needs. It also minimizes the amount of infrastructure required to support higher and richer traffic volumes. To do this, OS 110 incorporates these optimized techniques of format reduction, data compression, and caching. System administrators—as well as end users who are running the user agents—can also select the desired level of optimization. OS 110 incorporates advanced format reduction techniques, restructuring data to achieve optimal compression levels. Format reduction includes techniques that improve the efficiency of HTML, JavaScript, and CSS code prior to individual compression. Both generic and specific techniques can be used to compress data. Regular text may require only generic compression, whereas images, multimedia, and certain document types may require specific compression techniques.

At some point after OS 110 has received network data, client device 102 moves (212) from first zone 120 to second zone 130. Client device 102, which is now located in second zone 130, establishes (214) communications with second wireless network 134 through second WTS 132.

After second wireless network 134 receives the communications, second wireless network 134 routes (216) the request data to gateway 104. Gateway 104 converts the request data into IP based data packets so that network 108 and/or database 106 can process the data accordingly. Gateway 104 can send an authentication request to database 106 for authenticating, as described above in step 204. If the database returns authentication information that the authentication data was valid, gateway 104 connects the user to the rest of the network. Otherwise if the database returns authentication information that the authentication request was invalid, gateway 104 will not connect the user. In this exemplary embodiment, the authentication request is valid.

After gateway 104 has authenticated the user, gateway 104 forwards (218) the data packets to OS 110. As stated above, OS 110 can be provided with network data by using all three embodiments of "pushing", "pulling", and/or sampling the network data. OS 110 can use this network data to adjust its tuning settings based on the characteristics of the second wireless network 134. Once the OS 110 has adjusted its tuning settings, OS 110 can form optimized response data by manipulating any received response data based on the tunings settings that correspond to the second wireless network. The OS 110 can then transmit the optimized response data to the client device 102. As a result, OS 110 can provide a seamless transaction by optimizing the performance of the transmission, which was described above, of optimized response data (e.g. HTTP content data) to client device 102.

Figure 3:
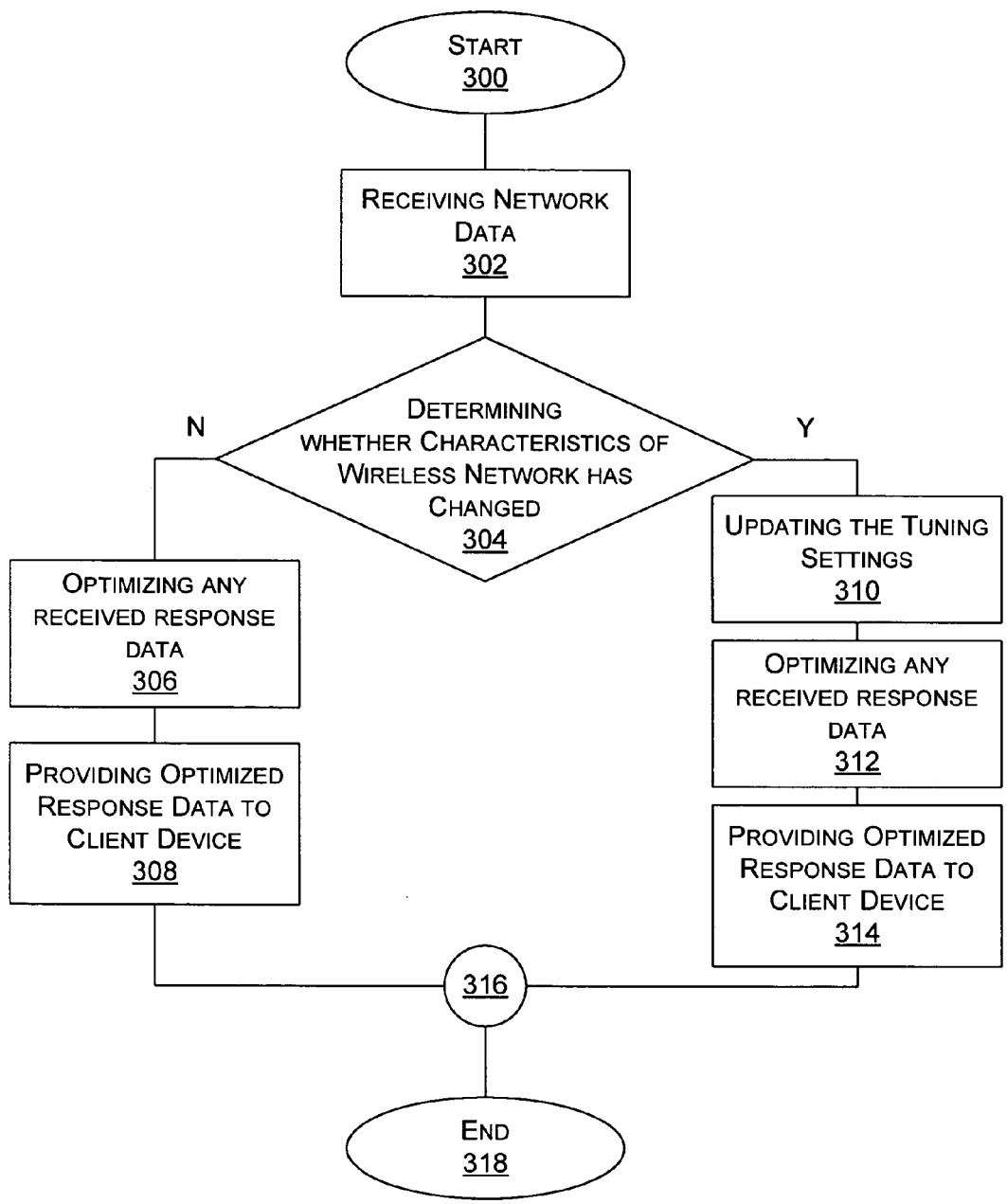
FIG. 3 is a flowchart representing an exemplary method for providing network data updates to the optimization server.

FIG. 3 is a flowchart representing an exemplary method for providing network data updates to the optimization server. It will be readily appreciated by one of ordinary skill in the art that the illustrated procedure can be altered to delete steps or further include additional steps. After initial start step 300, an OS receives (302) network data. As shown above, the OS can receive the network data by "pulling" the network data from a database, by receiving "pushed" network data from a gateway or a database, by sampling the network, or by any combination of the three.

After the OS has received the network data, the OS can determine (304) whether the characteristics of the wireless network has changed based on the received network data. For example, the characteristics can include the network's type, speed, packet loss, instantaneous packet loss, average packet loss, instantaneous latency, jitter, average latency, instantaneous bandwidth, average bandwidth, changes in bandwidth, etc. Further, the characteristics can include the usage patterns of the client device. For example, if the client device is attempting to download more data than the slow wireless link can provide, then it the OS may increase the compression ratio such that the data would get to the client device faster, even though the client is on a "fast" network. If the network has not changed, the OS can optimize (306) any received response data by manipulating the response data based on the current tuning settings. These tuning settings correspond to the current wireless network that provided the network data. The OS can then provide (308) optimized response data to the client device based on maintained tuning settings at the OS and the method can proceed to connector 316.

On the other hand, if the characteristics of the network that the client device is connected to has changed, the OS can update (310) the tuning settings based on the characteristic of the new wireless network, which allows OS to provide optimized communications from one or more web content servers to the client device. Then, the OS can optimize (312) any received response data by manipulating the response data based on the updated tuning settings. The OS can then provide (314) optimized response data to the client device based on the updated tuning settings. In some embodiments, the tuning settings are further updated based on user preferences. The method can proceed to connector 316 and then end (318).

For example, when a client device connects to the Internet and requests to download a web page, the client device has the ability to transmit request data packets through a gateway to the content servers. These data packets may relate to the requested web page and/or the URL associated with the web page. The content server receives these data packets and transmits response data that corresponds to the requested data packets. The OS receives the response data and optimizes the response data based on the tuning settings that correspond to the network characteristics of the wireless network that the client device is connected to. If the network characteristics change based on the movement of the client device or the traffic at the wireless network, the tuning settings can be readjusted.

The methods disclosed herein may be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand alone program or as a module, component, subroutine, or other unit suitable for use in a computing environment. A computer program can be deployed to be executed on one computer or on multiple computers at one site or distributed across multiple sites and interconnected by a communication network.

In the preceding specification, the invention has been described with reference to specific exemplary embodiments. It will however, be evident that various modifications and changes may be made without departing from the broader spirit and scope of the invention as set forth in the claims that follow. The specification and drawings are accordingly to be regarded as illustrative rather than restrictive sense. Other embodiments of the invention may be apparent to those skilled in the art from consideration of the specification and practice of the invention disclosed herein.

What is claimed is:

1. A method comprising:
    receiving, by an optimization server, network data associated with characteristics of a first type of cellular wireless network to which a client device is connected, wherein the network data includes information about the cellular wireless network that would affect delivery of content data to the client device;
    acquiring, by the optimization server, first tuning settings based on the network data, wherein the first tuning settings are of a plurality of stored tuning settings that include the first tuning settings corresponding to the first type of cellular network and a second tuning settings corresponding to a second type of cellular network;
    determining one or more optimization techniques based on the acquired first tuning settings;
    receiving, by the optimization server, content data from a content server, wherein the content data is used for displaying a web page requested by the client device;
    modifying, by the optimization server, the received content data using the one or more optimization techniques applied based on the acquired first tuning settings; and
    transmitting the modified content data to the client device.

2. The method of claim 1, wherein receiving network data includes pulling the network data from a database.

3. The method of claim 1, wherein receiving network data includes receiving pushed network data from a gateway.

4. The method of claim 1, wherein receiving network data includes sampling the characteristics of the cellular wireless network using feedback mechanisms.

5. The method of claim 1, wherein the modified data corresponds to the content data after being altered based on the provided tuning settings and a user's preferences.

6. The method of claim 1, wherein the acquired tuning settings reflect the performance of the cellular wireless network based on the network data.

7. The method of claim 1, wherein acquiring the first tuning settings includes adjusting them based on a user's preferences.

8. The method of claim 1, wherein acquiring first tuning settings is based on the network data received at the beginning of a session.

9. The method of claim 8, further comprising acquiring second tuning settings based on updated network data received during the session; and determining one or more optimization techniques based on the acquired second tuning settings, wherein the determined one or more optimization techniques based on the acquired tuning settings are used for modifying content data.

10. A method comprising:
    receiving, by an optimization server, network data associated with characteristics of a first type of cellular wireless network to which a client device is connected, wherein the network data includes information about the cellular wireless network that would affect delivery of content data to the client device;
    determining whether the network data has changed;
    updating, by the optimization server, tuning settings from the first tuning settings to a second tuning settings based on the determination, wherein the first tuning settings and the second tuning settings are of a plurality of stored tuning settings that include the first tuning settings corresponding to the first type of cellular network and the second tuning settings corresponding to a second type of cellular network;
    determining one or more optimization techniques based on the updated tuning settings;
    receiving, by the optimization server, content data from a content server, wherein the content data is used for displaying a web page requested by a client device;
    modifying, by the optimization server, the received content data using the one or more optimization techniques applied based on the updated tuning settings; and
    transmitting the modified content data to the client device.

11. The method of claim 10, wherein receiving network data includes pulling the network data from a database.

12. The method of claim 10, wherein receiving network data includes receiving pushed network data from a gateway or a database.

13. The method of claim 10, wherein receiving network data includes sampling the characteristics of the cellular wireless network using feedback mechanisms.

14. The method of claim 10, wherein the modified content data corresponds to the content data being altered based on the second tuning settings and a user's preferences.

15. A system comprising:
a hardware optimization server configured to:
receive network data associated with the characteristics of a first type of cellular wireless network to which a client device is coupled,
acquire first tuning settings based on the network data,
determine one or more optimization techniques based on the acquired first tuning settings;
receive content data from a content server,
modify the received content data using the one or more optimization techniques applied based on the acquired first tuning settings, and
transmit the modified content data to the client device,
wherein the network data includes information about the first cellular wireless network that would affect delivery of the content data to the client device, the first tuning settings are of a plurality of stored tuning settings that include the first tuning settings corresponding to the first type of cellular network and a second tuning settings corresponding to a second type of cellular network, and the content data is used for displaying a web page requested by the client device.

16. The system of claim 15, wherein the optimization server is further configured to:
update the tuning settings from the first tuning settings to the second tuning settings after receiving subsequent network data associated with the characteristics of a current cellular wireless network that the client device is connected to, wherein the current cellular wireless network can be the first cellular wireless network or the second cellular wireless network,
determine one or more optimization techniques based on the second tuning settings;
modify the content data based on the second tuning settings, and
provide the modified content data to the client device.

17. The system of claim 15, wherein the optimization server receives network data by pulling the network data from a database.

18. The system of claim 15, wherein the optimization server receives network data by receiving pushed network data from a gateway or a database.

19. The system of claim 15, wherein the optimization server receives network data by sampling the characteristics of the first cellular wireless network using feedback mechanisms.

20. A computer-readable storage medium storing instructions that, when executed by a computer, cause a computer to perform a method, the method comprising:
receiving, by an optimization server, network data associated with characteristics of a first type of cellular wireless network to which a client device is connected, wherein the network data includes information about the cellular wireless network that would affect delivery of content data to the client device;
acquiring, by the optimization server, a particular first tuning setting from a data storage device based on the network data, wherein the first tuning settings are of a plurality of stored tuning settings that include the first tuning settings corresponding to the first type of cellular network and a second tuning settings corresponding to a second type of cellular network;
determining one or more optimization techniques based on the acquired first tuning settings;
receiving, by the optimization server, content data from a content server, wherein the content data is used for displaying a web page requested by the client device;
modifying, by the optimization server, the received content data using the one or more optimization techniques applied based on the acquired first tuning settings; and
transmitting the modified content data to the client device.

* * * * *